United States Patent
Chan et al.

(10) Patent No.: US 10,062,315 B2
(45) Date of Patent: Aug. 28, 2018

(54) GATE DRIVING CIRCUIT AND DISPLAY DEVICE

(71) Applicant: HannStar Display Corporation, Taipei (TW)

(72) Inventors: Chien-Ting Chan, Tainan (TW); Yu-Tuan Hsu, Taichung (TW); Po-Yi Chen, Pingtung County (TW)

(73) Assignee: HannStar Display Corporation, Taipei (TW)

(*) Notice: Subject to any disclaimer, the term of this patent is extended or adjusted under 35 U.S.C. 154(b) by 0 days.

(21) Appl. No.: 15/347,794

(22) Filed: Nov. 10, 2016

(65) Prior Publication Data

US 2018/0025684 A1 Jan. 25, 2018

(30) Foreign Application Priority Data

Jul. 22, 2016 (CN) .......................... 2016 1 0580994

(51) Int. Cl.
*G09G 3/36* (2006.01)
*G09G 3/20* (2006.01)
*G11C 19/28* (2006.01)

(52) U.S. Cl.
CPC ......... *G09G 3/2092* (2013.01); *G11C 19/287* (2013.01); *G09G 3/3674* (2013.01); *G09G 2300/0809* (2013.01); *G09G 2310/0286* (2013.01)

(58) Field of Classification Search
CPC .......................... G09G 3/3674; G09G 3/3677
USPC .......................................................... 345/100
See application file for complete search history.

(56) References Cited

U.S. PATENT DOCUMENTS

| 2014/0028534 A1 | 1/2014 | Park et al. | |
| 2014/0062979 A1* | 3/2014 | Liu | G11C 19/184 |
| | | | 345/204 |
| 2014/0253424 A1* | 9/2014 | Yu | G11C 19/28 |
| | | | 345/100 |

* cited by examiner

*Primary Examiner* — Roy P Rabindranath
(74) *Attorney, Agent, or Firm* — CKC & Partners Co., Ltd.

(57) ABSTRACT

The invention provides a gate driving circuit and a display device. The gate driving circuit is configured to drive a display panel of the display device, and includes shift registers and at least a dummy shift register. The shift registers are respectively configured to generate and output scan signals to scan lines of the display panel, the dummy shift register is configured to generate a dummy scan signal before the scan signals are generated. The dummy scan signal and the scan signals are sequentially generated.

20 Claims, 6 Drawing Sheets

GATE DRIVING CIRCUIT AND DISPLAY DEVICE

RELATED APPLICATIONS

This application claims priority to Chinese Patent Application Serial Number 201610580994.8, filed on Jul. 22, 2016, which is herein incorporated by reference.

BACKGROUND

Field of the Invention

The invention relates to a gate driving circuit and a display device, and more particularly to a gate driving circuit and a display device including dummy shift registers.

Description of Related Art

A flat panel display device, such as a liquid crystal display (LCD) device or an organic light-emitting diode (OLEO) display device, generally has a lot of shift registers for controlling gray levels of all pixels displayed in the display device at the same time point. In addition, with advancing development technologies of thin film transistor (TFT) liquid crystal display, technologies of integrating a driving circuit (e.g. a gate driving circuit) on a display panel, such as a system on glass (SOG) technology, have, become widely applied to conventional display devices. However, for circuit designs of shift registers, the correctness of signals corresponding outputted at every time point should device. In a scan signal outputted from a shift register, the delay caused by resistive and capacitive loads should be shorter than a threshold resistive-capacitive delay to prevent the pixels corresponding to the shift register from displaying erroneous gray levels. For a high-resolution display device, the charge time of each scan signal is relatively s porter, and the scan signals generated by first several stages of shift registers have longer resistive-capacitive delays, thus easily resulting in an image display error issue.

SUMMARY

An objective of the invention is to provide a gate driving circuit and a display device, in which resistive-capacitive delays of scan signals inputted to a display panel can be reduced, thereby ensuring image display quality and stability.

One aspect of the invention is directed to a gate driving circuit which is configured to drive a display panel and includes $1^{st}$ to $N^{th}$ stage first shift registers and one or more first dummy shift registers. The $1^{st}$ to $N^{th}$ stage first shift registers are configured to respectively generate and output $1^{st}$ to $N^{th}$ stage first scan signals to first scan lines of the display panel. The one or more first dummy shift registers are configured to respectively generate and output one or more first dummy scan signals before the first scan signals are generated. The one or more first dummy scan signals and the first scan signals are sequentially outputted, and N is an integer.

In one or more embodiments of the invention, the one or more first dummy shift registers are $1^{st}$ to $M^{th}$ stage first dummy shift registers, where M is an integer multiple of 2.

In one or more embodiments of the invention, the one or more first dummy shift registers are $1^{st}$ to $M^{th}$ stage first dummy shift registers, where M is an integer greater than or equal to 3.

In one or more embodiments of the invention, the one or more first dummy shift registers are $1^{st}$ to $M^{th}$ stage first dummy shift registers, where M is 4.

In one or more embodiments of the invention, a $1^{st}$ stage first dummy shift register of the one or more first dummy shift registers is configured to generate a $1^{st}$ stage first dummy scan signal of the one or more first dummy scan signals according to a starting signal.

In one or more embodiments of the invention, the $1^{st}$ stage first shift register is configured to generate the $1^{st}$ stage first scan signal according to at least one first dummy scan signal of the one or more first dummy scan signals.

In one or more embodiments of the invention, the one or more first dummy scan signals are not inputted to the first scan lines.

In one or more embodiments of the invention, a $j^{th}$ stage first dummy shift register of the one or more first dummy shift registers is defined as a $j^{th}$ stage shift register, a $j^{th}$ stage first dummy scan signal of the one or more first dummy scan signals is defined as a $j^{th}$ stage scan signal, the $k^{th}$ stage first shift register of the $1^{st}$ to $N^{th}$ stage first shift registers is defined as a $(k+M)^{th}$ stage shift register, and the $k^{th}$ stage first scan signal of the $1^{st}$ to $N^{th}$ stage first scan signals is defined as a $(k+M)^{th}$ stage scan signal, where M is an integer. The $i^{th}$ stage shift register of the shift registers includes a precharge unit, a first pull-down unit, an output unit and a second pull-down unit. The precharge unit is configured to receive a first input signal and a second input signal and to output a control signal via a first node. The first pull-down unit is coupled to the first node, and is configured to receive a third input signal. The output, unit is configured to receive a fourth input signal and the control signal and to output an $i^{th}$ stage scan signal of the scan signals via a second node. The second pull-down unit is coupled to the second node, and is configured to receive a fifth input signal. The fourth input signal and the fifth input signal of the $i^{th}$ stage shift register are respectively ones of first to fourth clock signals, where j is an integer less than or equal to M, and k is an integer less than or equal to N.

In one or more embodiments of the invention, the precharge unit includes a first transistor and a second transistor. The first transistor has a first gate a first source and a first drain. The first gate and one of the first source and the first drain of the first transistor are configured to receive the first input signal, and the other of the first source and the first drain of the first transistor is coupled to the first node. The second transistor has a second gate, a second source and a second drain. The second gate and one of the second source and the second drain of the second transistor are configured to receive the second input signal, and the other of the second source and the second drain of the second transistor is coupled to the first node.

In one or more embodiments of the invention, when i is equal to 1, each of the first input signal and the second input signal is a start ng signal, when i is equal to 2, the first input signal is the $1^{st}$ stage scan signal of the scan signals, and the second input signal is the starting signal; when i is equal to n, the first input signal is the $(n-1)^{th}$ stage scan signal of the plurality of scan signals, and the second input signal is the $(n-2)^{th}$ stage scan signal of the plurality of scan signals, where n is an integer greater than 2 and less than or equal to (M+N).

In one or more embodiments of the invention, the first pull-down unit includes a third transistor. The third transistor has a third gate, a third source and a third drain. The third gate of the third transistor is configured to receive the third input signal, one of the third source and the third drain of the third transistor is configured to receive the reference voltage, and the other of the third source and the third drain of the third transistor is coupled to the first node. When i is less than or equal to (M+N−2), the third input signal is the (i+2)$^{th}$ scan signal of the plurality of scan, signals; when i is equal to (M+N−1) or (M+N), the third input signal is a reset signal.

In one or more embodiments of the invention, the output unit includes a capacitor, a fourth transistor and a fifth transistor. The capacitor includes a first terminal and a second terminal. The first terminal and the second terminal of the capacitor are respectively coupled to the first node and the second node. The fourth transistor has a fourth gate, a fourth source and a fourth drain. The fourth gate of the fourth transistor is coupled to the first node, one of the fourth source and the fourth drain of the fourth transistor is configured to receive the fourth input signal, and the other of the fourth source and the fourth drain of the fourth transistor is coupled to the second node. The fifth transistor has a fifth gate, a fifth source and a fifth drain. The fifth gate of the fifth transistor is coupled to the second node, one of the fifth source and the fifth drain of the fifth transistor is configured to receive the fourth input signal, and the other of the fifth source and the fifth drain of the fifth transistor is coupled to the second node. When i is equal to (n−3), the fourth input signal is the first clock signal; when i is equal to (n−2) the fourth input signal is the second clock signal; when i is equal to (n−1), the fourth input signal is the third clock signal; when i is equal to n, the fourth input signal is the fourth clock signal where n is an integer less than or equal to (M+N+3) and multiple of 4.

In one or more embodiments of the invention, the second pull-down unit includes a sixth transistor. The sixth transistor has a sixth gate, a sixth source and a sixth drain. The sixth gate of the sixth transistor is configured to receive the fifth input signal, one of the sixth source and the sixth drain of the sixth transistor is configured to receive a reference voltage, and the other of the sixth source and the sixth drain of the sixth transistor is coupled to the second node. When i is equal to (n−3) the fifth input signal is the third clock signal; when i is equal to (n−2), the fifth input signal is the fourth clock signal; when i is equal to (n−1), the fifth input signal is the first clock signal; when i is equal to n, the fifth input signal is the second clock signal, where n is an integer less than or equal to (M+N+3) and multiple of 4.

In one or more embodiments of the invention, when i is an integer from 4 to (M+N), the first pull-down unit includes a seventh transistor. The seventh transistor has a seventh gate, a seventh source and a seventh drain. The seventh gate of the seventh transistor is configured to receive a starting signal, one of the seventh source and the seventh drain of the seventh transistor is configured to receive a reference signal, and the other of the seventh source and the seventh drain of the seventh transistor is coupled to the first node.

In one or more embodiments of the invention, the gate driving circuit further includes 1$^{st}$ to N$^{th}$ stage second shift registers and one or more second dummy shift registers. The 1$^{st}$ to N$^{th}$ stage second shift registers are configured to respectively generate and output 1$^{st}$ to N$^{th}$ stage second scan signals to second scan signals of the display panel. The one or more second dummy shift registers are configured to respectively generate and output one or more second dummy scan signals before the second scan signals are generated. The one or more second dummy scan signals and the second scan signals are sequentially outputted, the one or more second dummy scan signals respectively have substantially the same time sequences as those of the one or more first dummy scan signals, and the second scan signals respectively have substantially the same time sequences as those of the first scan signals.

Another aspect of the invention is directed to a display device which includes a display panel and a driving circuit. The display panel has opposite first and second sides. The driving circuit is configured to drive the display panel and includes 1$^{st}$ to N$^{th}$ stage first shift registers, one or more first dummy shift registers, 1$^{st}$ to N$^{th}$ stage second shift registers and one or more second dummy shift registers. The 1$^{st}$ to N$^{th}$ stage first shift registers are configured to respectively generate and output 1$^{st}$ to N$^{th}$ stage first scan signals to first scan signals of the display panel. The one or more first dummy shift registers are configured to respectively generate and output one or more first dummy scan signals before the first scan signals are generated. The 1$^{st}$ to N$^{th}$ stage second shift registers are configured to respectively generate and output 1$^{st}$ to N$^{th}$ stage second scan signals to a plurality of second scan signals of the display panel. The one or more second dummy shift registers are configured to respectively generate and output one or more second dummy scan signals before the second scan signals are generated. The one or more first dummy scan signals and the first scan signals are sequentially outputted, the one or more second dummy scan signals and the second scan signals are sequentially outputted, the one or more second dummy scan signals respectively have substantially the same time sequences as those of the one or more first dummy scan signals, the second scan signals respectively have substantially the same time sequences as those of the first scan signals, and N is an integer.

In one or more embodiments of the invention, the one or more first dummy shift registers are 1$^{st}$ to M$^{th}$ stage first dummy shift registers, and the one or more second dummy shift registers are 1$^{st}$ to M$^{th}$ stage second dummy shift registers, where M is an integer multiple of 2.

In one or more embodiments of the invention, the one or more first dummy shift registers are 1$^{st}$ to M$^{th}$ stage first dummy shift registers, and the one or more second dummy shift registers are 1$^{st}$ to M$^{th}$ stage second dummy shift registers, where M is an integer greater than or equal to 3.

In one or more embodiments of the invention, the one or more first dummy shift registers are 1$^{st}$ to M$^{th}$ stage first dummy shift registers, and the one or more second dummy shift registers are 1$^{st}$ to M$^{th}$ stage second dummy shift registers, where M is 4.

BRIEF DESCRIPTION OF THE DRAWINGS

The foregoing aspects and many of the accompanying advantages of this invention will become more readily appreciated as the same becomes better understood by reference to the following detailed description, when taken in conjunction with the accompanying drawings.

DETAILED DESCRIPTION

The detailed explanation of the invention is described as following. The described preferred embodiments are presented for purposes of illustrations and description, and they are not intended to limit the scope of the invention.

Figure 1:
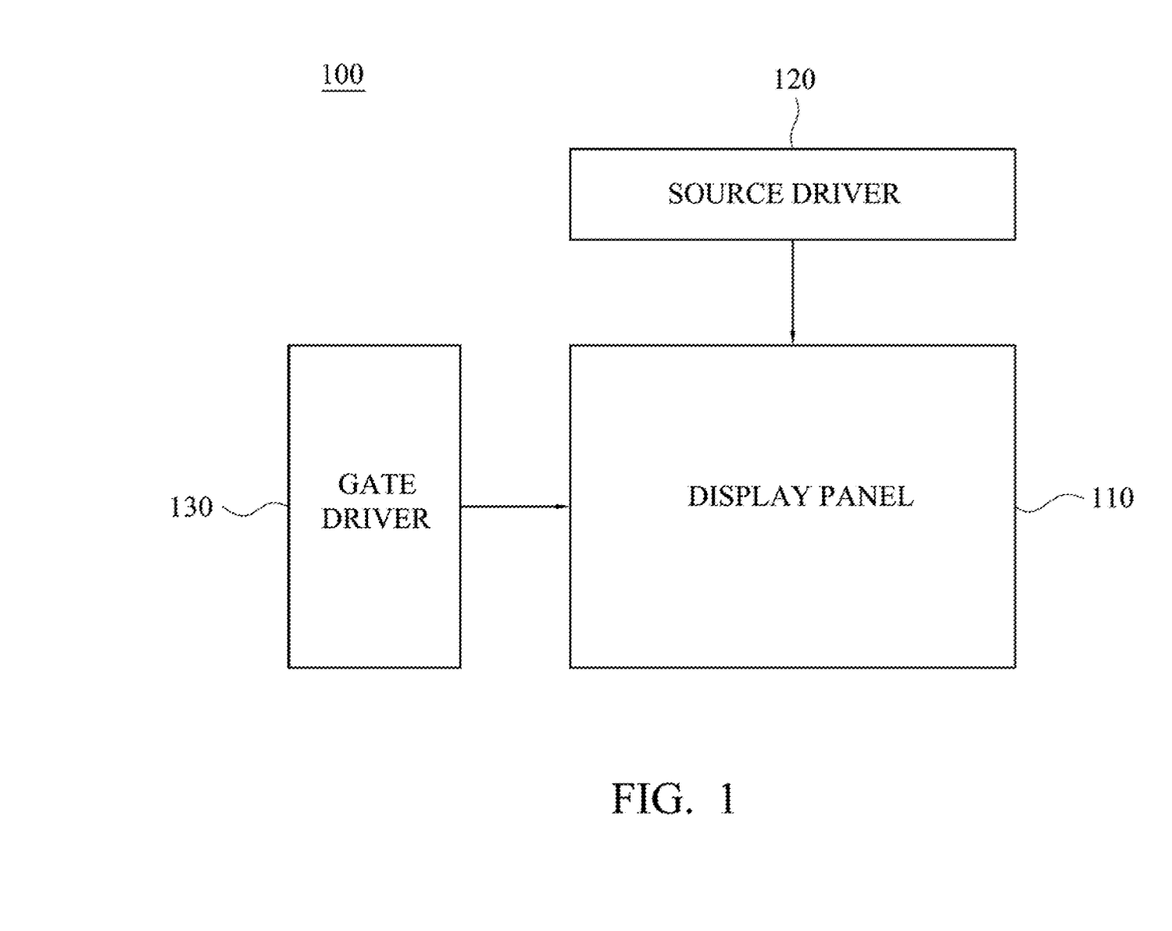
FIG. 1 is a schematic diagram of a display device in accordance with some embodiments of the invention.

Referring to FIG. 1, which is, a schematic diagram of a display device 100. The display device 100 includes a display panel 110, a source driver 120 and a gate driver 130. The display panel 110 includes pixels arranged in a matrix for collectively displaying an image. The display panel 110 may be, for example, a liquid crystal display (LCD) panel of twisted nematic (TN) mode, in-plane switching (IPS) mode, fringe-field switching (FFS) mode, vertical alignment (VA) mode or other different modes, or an organic light-emitting diode (OLED) display panel, but is not limited thereto. The source driver 120 is electrically connected to the display panel 110, and is configured to convert image data into source driving signals and transmit the source driving signals to the display panel 110. The gate driver 130 is configured to generate and transmit gate driving signals to the display panel 110. The display panel 110 displays an image by the driving of the source driving signals and the gate driving signals.

Figure 2:
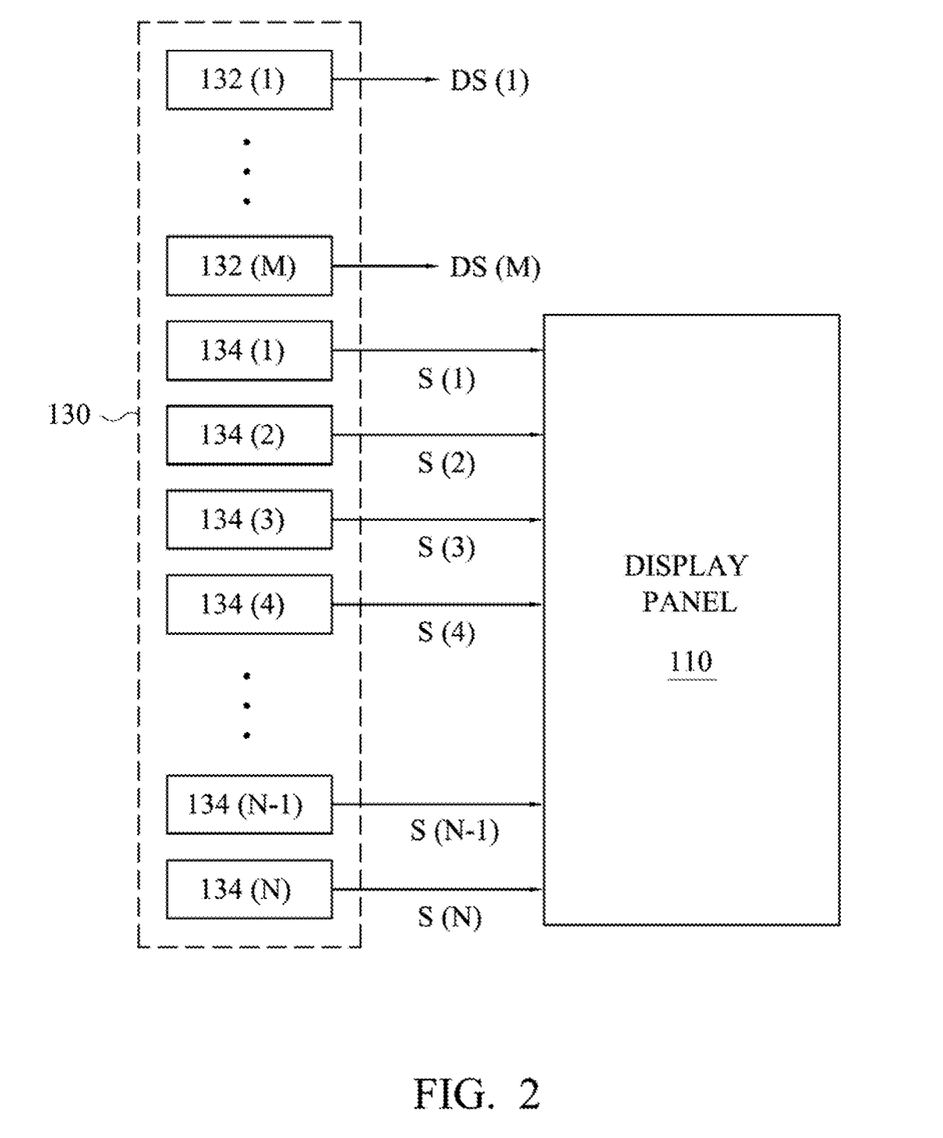
FIG. 2 is a schematic diagram of the display panel and the gate driver shown in FIG. 1.

FIG. 2 is a schematic diagram of the display panel 110 and the gate driver 130 shown in FIG. 1. As shown in FIG. 2, the gate driver 130 includes dummy shift registers 132(1)-132(M) and shift registers 134(1)-134(N). The dummy shift registers 132(1)-132(M) and the shift registers 134(1)-134(N) are, configured to respectively generate dummy scan signals DS(1)-DS(M) and scan signals S(1)-S(N) according to at least one of a starting signal STV, clock signals C1-C4 and a reset signal RST. The starting signal STV transitions to a high level at the beginning of a frame period, the clock signals C1-C4 sequentially transition to a high level and sequentially transition to a low level during the frame period, and the reset signal RST transitions to a high level at the end of the frame period. Furthermore, the shift registers 134(1)-134(N) are configured to respectively transmit the scan signals S(1)-S(N) to scan lines (not shown) of the display panel 110. For illustration, the $1^{st}$ stage shift register 134(1) is configured to generate and transmit the $1^{st}$ stage scan signal S(1) to a first scan line of the scan lines, the $2^{nd}$ stage shift register 134(2) is configured to generate and transmit the $2^{nd}$ stage scan signal S(2) to a second scan line of the scan lines, and so on.

In the invention, the dummy shift registers 132(1)-132(M) are disposed prior to the shift registers 134(1)-134(N), and the dummy scan signals DS(1)-DS(M) generated by the dummy shift registers 132(1)-132(M) are not inputted to the scan lines of the display panel 110. In addition, the dummy scan signals DS(1)-DS(M) are generated and outputted before the scan signals S(1)-S(N) are generated, and the dummy scan signals DS(1)-DS(M) and the scan signals S(1)-S(N) are sequentially generated and outputted.

For facilitating description of FIGS. 3A and 3B, in the following, the dummy shift registers 132(1)-132(M) and the shift registers 134(1)-134(N) shown in FIG. 2 are respectively represented by shift registers SR(1)-SR(M+N), and the dummy scan signals DS(1)-DS(M) and the scan signals S(1)-S(N) are respectively represented by scan signals SC(1)-SC(M+N).

Figure 3A:
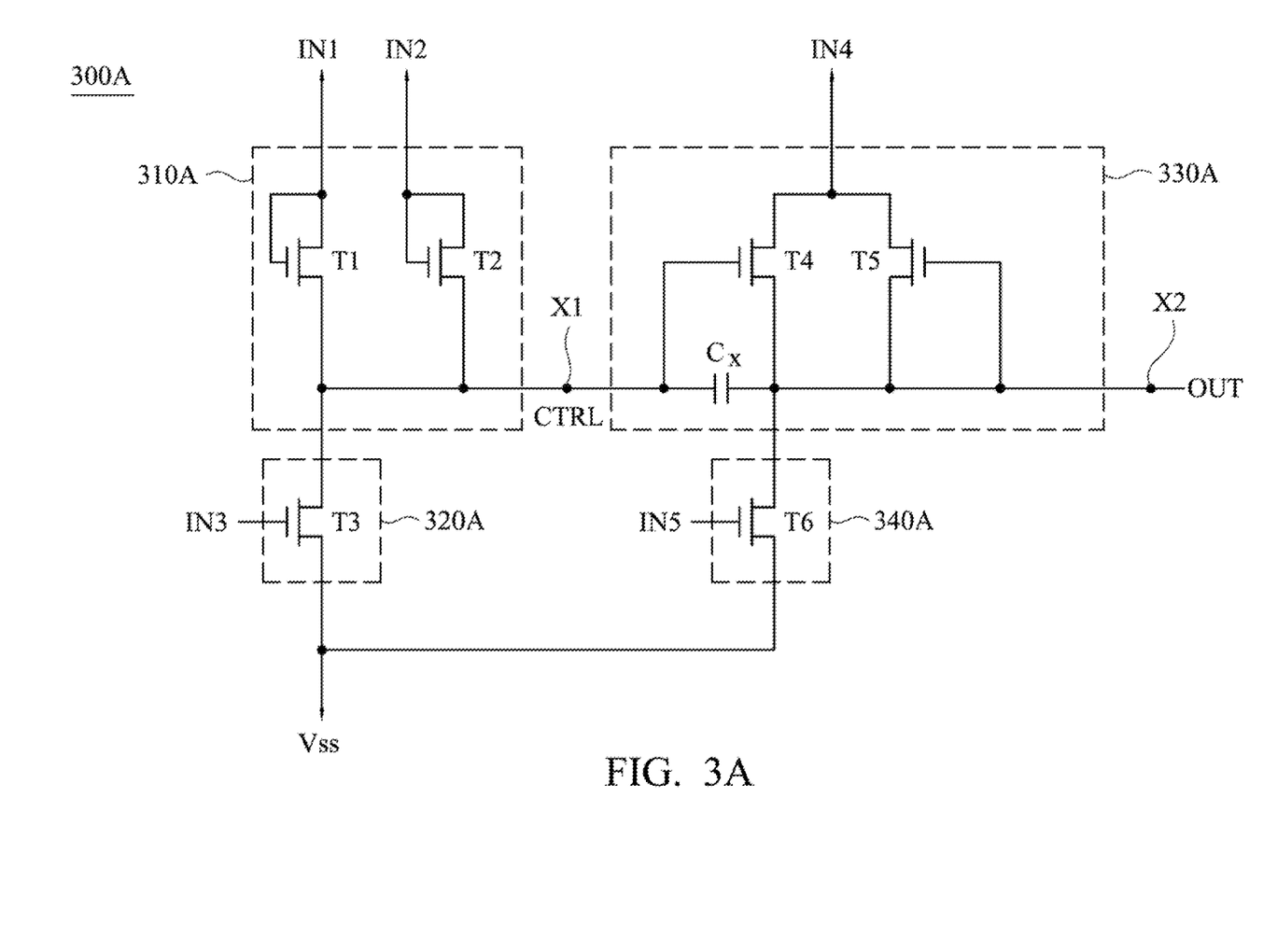
FIGS. 3A and 3B are circuit diagrams of shift register circuits in accordance with some embodiments of the invention.

FIGS. 3A and 36 are circuit diagrams of the shift register circuits 300A and 300B in accordance with some embodiments of the invention, respectively. The shift register circuit 300A may be a circuit in each of the shift registers SR(1)-SR(3), and the shift register circuit 300B may be a circuit in each of the shift registers SR(4)-SR(M+N).

As shown in FIG. 3A, the shift register circuit 300A includes a precharge unit 310A, a first pull-down unit 320A, an output unit 330A and a second pull-down unit 340A. The precharge unit 310A is configured to receive the input signal IN1-IN2 and to output a control signal CTRL via a node X1. The first pull-down unit 320A is coupled to the precharge unit 310A, and is configured to receive the input signal IN3 and pull-down the voltage level of the node X1. The output unit 330A is coupled to the precharge unit 310A, and is configured to receive the control signal CTRL and the input signal IN4 and to output a scan signal OUT via a node X2. The second pull-down unit 340A is coupled to the first pull-down unit 320A and the output unit 330A, and is configured to receive the input signal IN5 and to reset the scan signal OUT.

The precharge unit 310A includes transistors T1 and T2. The first terminal and second terminal of the transistor T1 are configured to receive an input signal IN1, and the third terminal of the transistor T1 is coupled to a node X1. The first terminal and second terminal of the transistor T2 are configured to receive an input signal IN2, and the third terminal of the transistor T2 is coupled to a node X1. In this embodiment, for each of the transistors T1-T7, the first terminal is the gate, the second terminal of the transistor is one of the source and the drain; and the third terminal of the transistor is the other of the source and the drain.

The first pull-down unit 320A includes a transistor T3. The first terminal of the transistor T3 is configured to receive the input signal IN3, the second terminal of the transistor T3 is configured to receive a reference voltage Vss, and the third terminal of the transistor T3 is coupled to the node X1.

The output unit 330A includes a capacitor Cx and transistors T4 and T5. The first and second terminal of the capacitor Cx are coupled to the nodes X1 and X2, respectively. The first terminal of the transistor T4 is coupled to the node X1, the second terminal of the transistor T4 is configured to receive the input signal IN4, and the third terminal of the transistor T4 is coupled to the node X2. The first terminal and third terminal of the transistor T5 are coupled to the node X2, and the second terminal of the transistor T5 is configured to receive the input signal IN.

The second pull-down unit 340A includes a transistor T6. The first terminal of the transistor 16 is configured to receive the input signal IN5, the second terminal of the transistor T6 is configured to receive the reference voltage Vss, and the third terminal of the transistor T6 is coupled to the node X2.

If the shift register circuit 300A is a circuit in the shift register SR(1), the input signal IN1-IN5 are the starting signal STV the starting signal STV, the scan signal SC(3) and the clock signals C1 and C3, respectively, and the output signal OUT is the scan signal SC(1). If the shift register circuit 300A is a circuit in the shift register SR(2), the input signal IN1-IN5 are the scan signal SC(1), the starting signal STV, the scan signal SC(4) and the clock signals C2 and C4, respectively, and the output signal OUT is the scan signal SC(2). If the shift register circuit 300A is a circuit in the shift register SR(3), the input signal IN1-IN5 are the scan signals SC(2), SC(1) and SC(5) and the clock signals C3 and C1, respectively, and the output signal OUT is the scan signal SC(3).

Figure 3B:
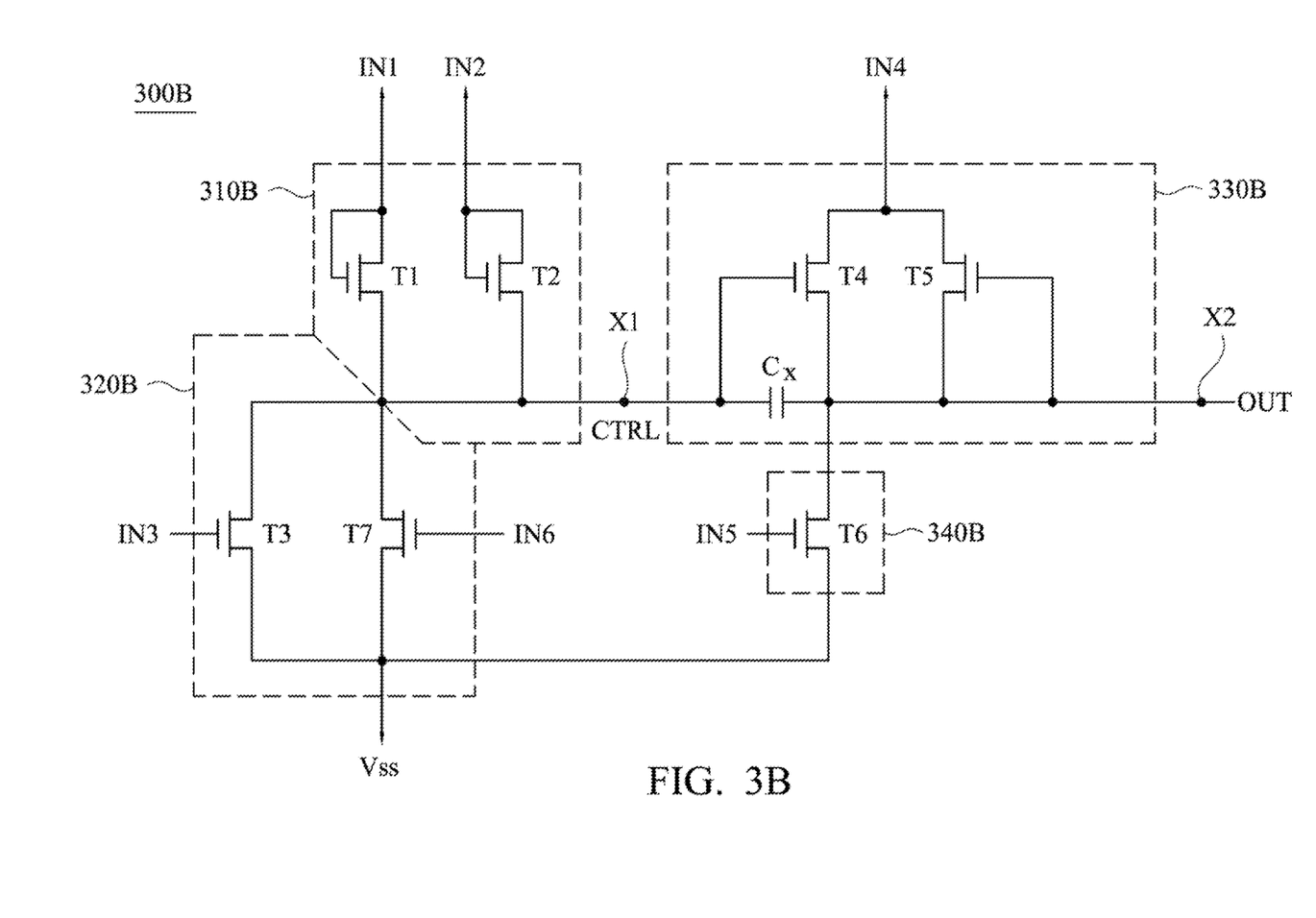

As shown in FIG. 3B, the shift register circuit 300B includes a precharge unit 310B, a first pull-down unit 320B, an output unit 330B and a second pull-down unit 340B. The precharge unit 310B, the output unit 330B and the second pull-down unit 340B are respectively similar to the precharge unit 310A, the output unit 330A and the second pull-down unit 340A in FIG. 3A, and the description is not repeated herein.

The first pull-down unit 320A includes transistors T3 and T7. The first terminal of the transistor T3 is configured to receive the input signal IN3, the second terminal of the transistor T3 is configured to receive the reference voltage Vss, and the third terminal of the transistor T3 is coupled to the node X1. The first terminal of the transistor T7 is configured to receive the input signal IN6, the second terminal of the transistor T7 is configured to receive the reference voltage Vss, and the third terminal of the transistor T7 is coupled to the node X1.

If the shift register circuit 300B is a circuit in the shift register SR(i) and i is an integer greater than or equal to 4 and less than or equal to (M+N−2), the input signals IN1-IN3 and IN6 are the scan signals SC(i−1), SC(i−2) and SC(i−2) and the starting signal STV, respectively. The input signal IN4 of the shift registers SR(4)-SR(M+N−2) are in a sequential order of the clock signals C4, C1, C2 and C3, and the input signal IN5 of the shift registers SR(4)-SR(M+N−2) are in a sequential order of the clock signals C2, C3, C4 and C1. For example, if (M+N−2) is an integer greater than 11, the input signal IN4 of the shift registers SR(4)-SR(M+N−2) are respectively C4, C1 C2, C3, C4, C1, C2, C3 . . . , and the input signal IN5 of the shift registers SR(4)-SR(M+N−2) are respectively C2 C3, C4, C1, C2, C3, C4, C1 . . . Taking (M+N) being multiple of 4 as an example, if the shift register circuit 300B is a circuit in the shift register SR(M+N−1), the input signal IN1-IN6 are the scan signals SC(M+N−2) and SC(M+N−3), the reset signal RST, the clock signals C3 and C1 and the starting signal STV, respectively. If the shift register circuit 300B is a circuit in the shift register SR(M+N), the input signal IN1-IN6 are the scan signals SC(M+N−1) and SC(M+N−2) the reset signal RST, the clock signals C4 and C2 and the starting signal STV, respectively. In the shift registers SR(M+N−1) and SR(M+N), the clock signals corresponding to the input signals IN4 and IN5 are associated with the value of (M+N), and the relation between the input signals IN4 and IN5 and (M+N) can be known from the above description and is not repeated herein.

In some embodiments, the display device 100 of the invention is a system on glass (SOG) display device; that is, the gate driver 130 is fabricated on a substrate (not shown) of the display device 100. As such, the electrical elements in the gate driver 130 (e.g. the transistor T1-T7 and/or the capacitor Cx in FIGS. 3A and 3B) and the electrical elements in the display panel 110 can be fabricated by using the same processes.

Figure 4:
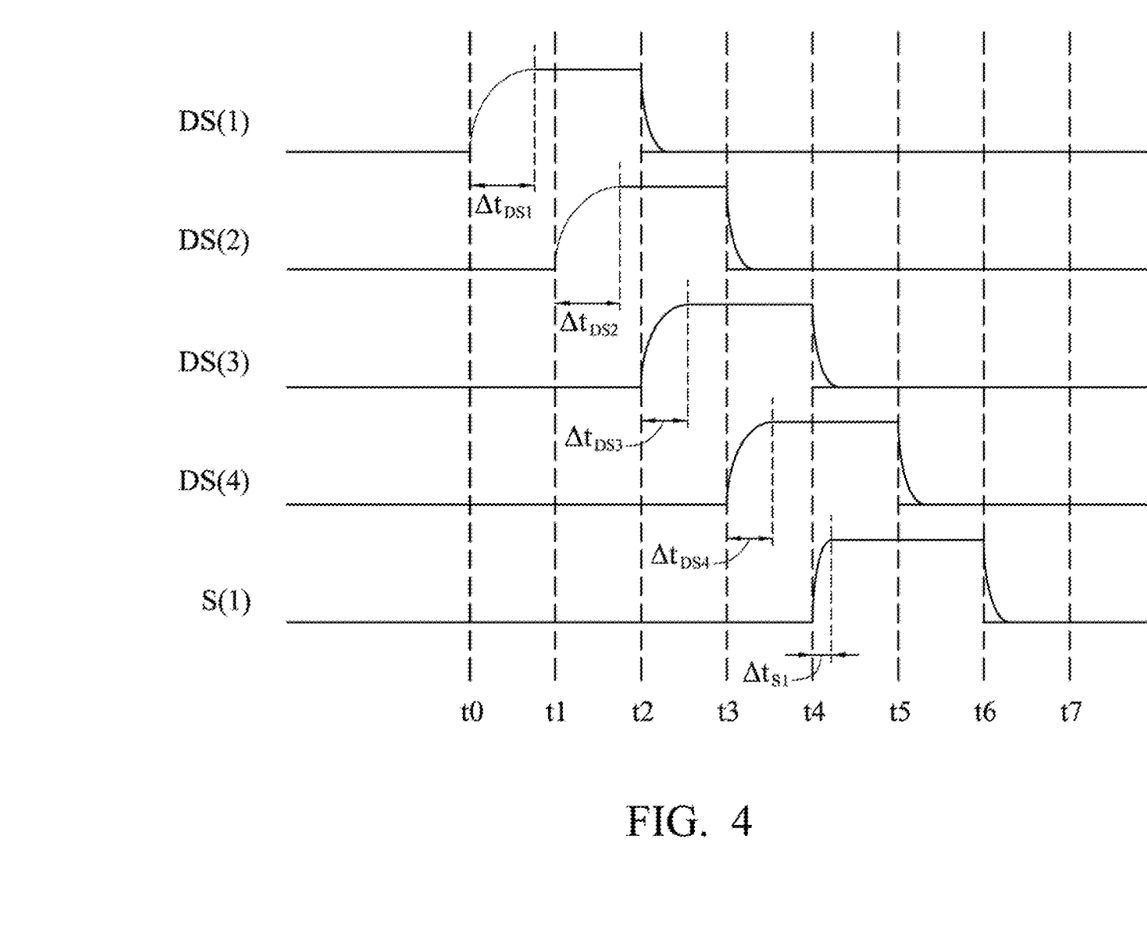
FIG. 4 is a time sequential diagram of the signals outputted by the gate driver in FIG. 2.

FIG. 4 is a time sequential diagram of the signals outputted by the gate driver 130 in FIG. 2. The number of dummy shift registers 132(1)-132(M) is exemplified by 4 (i.e. M is equal to 4), and for simplifying description, FIG. 4 only illustrates the time sequences of the 1$^{st}$ stage scan signal S(1) but omits the time sequences of the 2$^{nd}$ -N$^{th}$ stage scan signals S(2)-S(N). In FIG. 4, the dummy scan signals DS(1)-DS(4) and the 1$^{st}$ stage scan signal S(1) sequentially start to transition from a low level to a high level at times t0-t4, and sequentially start to transition from a high level to a low level at times t2-t6. The time durations required for the dummy scan signals DS(1)-DS(4) and the 1$^{st}$ stage scan signal S(1) to transition from a low level to a high level are respectively $\Delta t_{DS1}$, $\Delta t_{DS2}$, $\Delta t_{DS3}$, $\Delta t_{DS4}$ and $\Delta t_{S1}$, which respectively represent resistive-capacitive delays of the dummy scan signals DS(1)-DS(4) and the 1$^{st}$ stage scan signal S(1), where any of the time durations $\Delta t_{DS1}$ and $\Delta t_{DS2}$ is longer than any of the time durations $\Delta t_{DS3}$ and $\Delta t_{DS4}$, and any of the time durations $\Delta t_{DS3}$ and $\Delta t_{DS4}$ is longer than the time duration $\Delta t_{S1}$.

As can be seen from the time sequential diagram of FIG. 4, the time durations required for the dummy scan signals DS(1)-DS(4) and the 1$^{st}$ stage scan signal S(1) to transition from a low level to a high level are gradually reduced. Because the dummy scan signals DS(1)-DS(4) are not inputted to the scan lines of the display panel 110, regardless of the relationship between the time durations $\Delta t_{DS1}$, $\Delta t_{DS2}$, $\Delta t_{DS3}$ and $\Delta t_{DS4}$ and a threshold resistive-capacitive delay, if the time duration $\Delta t_{S1}$ is shorter than the threshold resistive-capacitive delay, the display panel 110 is assured to be prevented from being affected by the scan signals S(1)-S(N) to display an error image.

As can be seen from the above, in the invention, the design of dummy shift registers can reduce resistive-capacitive delays of scan signals inputted to a display panel, so as to prevent the display panel from displaying an error image due to overlong resistive-capacitive delays of the scan signals, thereby ensuring its image display quality and stability.

It is noted that the number of dummy shift registers of the invention may be one or more and may be determined according to practical product requirements. For example, in some embodiments, the number of dummy shift registers may be even (i.e. multiple of 2); in some embodiments, the number of dummy shift registers may be 3 or more than 3; in some embodiments, the number of dummy shift registers is 4, In addition, the circuit of the dummy shift registers and the shift registers of the invention may be correspondingly designed according to practical product requirements and are not limited to those shown in FIGS. 3A and 3B.

Figure 5:
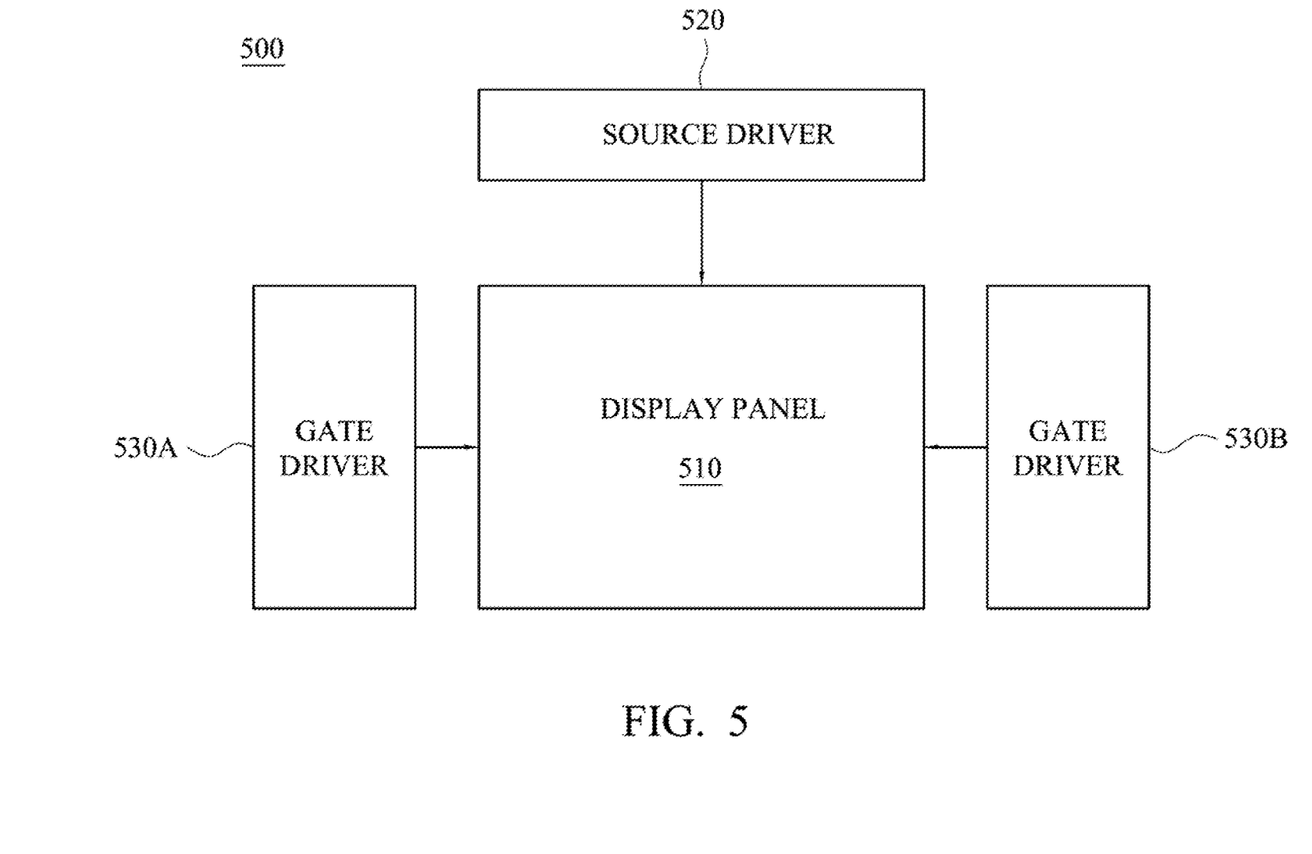
FIG. 5 is a schematic diagram of a display device in accordance with some embodiments of the invention.

The designs of dummy shift registers in the abovementioned embodiments may also be applied to a display device with bi-directional driving, Please refer to FIG. 5, which is a schematic diagram of a display device 500. The display device 500 includes a display panel 510, a source driver 520 and gate drivers 530A and 530B. The display device 500 is similar to the display device 100 of FIG. 1. The difference between the display devices 100 and 500 is that the display device 500 includes two gate drivers (i.e. the gate drivers 530A and 530B). As shown in FIG. 5, the gate drivers 530A and 530B are disposed at the left and right sides of the display panel 510, respectively, and collectively transmit gate driving signals to the display panel 510. In another embodiment, the designs of the gate drivers 530A and 530B may be adjusted in accordance with various design requirements. The gate drivers 530A and 530B may include the same number of dummy shift registers, and the time sequences of the dummy scan signals outputted by the gate drivers 530A are respectively the same as those of the dummy scan signals outputted by the gate drivers 530B. In addition, The gate drivers 530A and 533E may include the same number of shift register and/or the same number of dummy shift registers, and the time sequences of the scan signals and/or the time sequences of the dummy scan signals outputted by the gate drivers 530A are respectively the same as those of the scan signals and/or those of the dummy scan signals outputted by the gate drivers 530B. In some embodiments, each of the gate drivers 530A and 530B includes the dummy shift registers 132(1)-132(M) and the shift registers 134(1)-134(N) shown in FIG. 2. The display panel 510 and the source driver 520 are similar to the display panel 110 and the source driver 120 of FIG. 1, respectively, and the description is not described again herein.

It will be apparent to those skilled in the art that various modifications and variations can be made to the structure of the invention without departing from the scope or spirit of the invention. In view of the foregoing, it is intended that the invention cover modifications and variations of this invention provided they fall within the scope of the following claims.

What is claimed is:

1. A gate driving circuit for driving a display panel, the gate driving circuit comprising:

$1^{st}$ to $N^{th}$ stage first shift registers configured to respectively generate and output $1^{st}$ to $N^{th}$ stage first scan signals to a plurality of scan lines of the display panel; and one or more first dummy shift registers configured to respectively generate and output one or more first dummy scan signals before the first scan signals are generated;

wherein the one or more first dummy scan signals and the first scan signals are sequentially outputted, and N is an integer;

wherein a $j^{th}$ stage first dummy shift register of the one or more first dummy shift registers is defined as a $j^{th}$ stage shift register, a $j^{th}$ stage first dummy scan signal of the one or more first dummy scan signals is defined as a $j^{th}$ stage scan signal, the $k^{th}$ stage first shift register of the $1^{st}$ to $N^{th}$ stage first shift registers is defined as a $(k+M)^{th}$ stage shift register, and the $k^{th}$ stage first scan signal of the $1^{st}$ to $N^{th}$ stage first scan signals is defined as a $(k+M)^{th}$ stage scan signal, wherein an $i^{th}$ stage shift register of the shift registers comprises:

a precharge unit configured to receive a first input signal and a second input signal and to output a control signal via a first node;

a first pull-down unit coupled to the first node and configured to receive a third input signal;

an output unit configured to receive a fourth input signal and the control signal and to output an $i^{th}$ stage scan signal of the plurality of scan signals via a second node; and a second pull-down unit coupled to the second node and configured to receive a fifth input signal;

wherein the fourth input signal and the fifth input signal of the $i^{th}$ stage shift register are respectively ones of first to fourth clock signals, M is an integer, j is an integer less than or equal to M, and k is an integer less than or equal to N.

2. The gate driving circuit of claim 1, wherein the one or more first dummy shift registers are $1^{st}$ to $M^{th}$ stage first dummy shift registers, and M is an integer multiple of 2.

3. The gate driving circuit of claim 1, wherein the one or more first dummy shift registers are $1^{st}$ to $M^{th}$ stage first dummy shift registers, and M is an integer greater than or equal to 3.

4. The gate driving circuit of claim 1, wherein the one or more first dummy shift registers are $1^{st}$ to $M^{th}$ stage first dummy shift registers, and M is 4.

5. The gate driving circuit of claim 1, wherein a $1^{st}$ stage first dummy shift register of the one or more first dummy shift registers is configured to generate a $1^{st}$ stage first dummy scan signal of the one or more first dummy scan signals according to a starting signal.

6. The gate driving circuit of claim 1, wherein the $1^{st}$ stage first shift register is configured to generate the $1^{st}$ stage first scan signal according to at least one first dummy scan signal of the one or more first dummy scan signals.

7. The gate driving circuit of claim 1, wherein the one or more first dummy scan signals are not inputted to the plurality of scan lines.

8. The gate driving circuit of claim 1, wherein the precharge unit comprises:

a first transistor having a first gate, a first source and a first drain, wherein the first gate and one of the first source and the first drain are configured to receive the first input signal, and the other of the first source and the first drain is coupled to the first node; and a second transistor having a second gate, a second source and a second drain, wherein the second gate and one of the second source and the second drain are configured to receive the second input signal, and the other of the second source and the second drain is coupled to the first node.

9. The gate driving circuit of claim 8, wherein:

when i is equal to 1, each of the first input signal and the second input signal is a starting signal;

when i is equal to 2, the first input signal is the $1^{st}$ stage scan signal of the plurality of scan signals, and the second input signal is the starting signal; and when i is equal to n, the first input signal is the $(n-1)^{th}$ stage scan signal of the plurality of scan signals, and the second input signal is the $(n-2)^{th}$ stage scan signal of the plurality of scan signals;

wherein n is an integer greater than 2 and less than or equal to (M+N).

10. The gate driving circuit of claim 1, wherein the first pull-down unit comprises:

a third transistor having a third gate, a third source and a third drain, wherein the third gate is configured to receive the third input signal, one of the third source and the third drain is configured to receive the reference voltage, and the other of the third source and the third drain is coupled to the first node;

wherein:

when i is less than or equal to (M+N−2), the third input signal is the (i+2)th stage scan signal of the plurality of scan signals; and when i is equal to (M+N−1) or (M+N), the third input signal is a reset signal.

11. The gate driving circuit of claim 1, wherein the output unit comprises:

a capacitor having a first terminal and a second terminal, wherein the first terminal and the second terminal of the capacitor are respectively coupled to the first node and the second node;

a fourth transistor having a fourth gate, a fourth source and a fourth drain, wherein the fourth gate is coupled to the first node, one of the fourth source and the fourth drain is configured to receive the fourth input signal, and the other of the fourth source and the fourth drain is coupled to the second node; and a fifth transistor having a fifth gate, a fifth source and a fifth drain, wherein the fifth gate is coupled to the second node, one of the fifth source and the fifth drain is configured to receive the fourth input signal, and the other of the fifth source and the fifth drain is coupled to the second node;

wherein:

when i is equal to (n−3), the fourth input signal is the first clock signal;

when i is equal to (n−2), the fourth input signal is the second clock signal;

when i is equal to (n−1), the fourth input signal is the third clock signal; and when i is equal to n, the fourth input signal is the fourth clock signal;

wherein n is an integer less than or equal to (M+N+3) and multiple of 4.

12. The gate driving circuit of claim 1, wherein the second pull-down unit comprises:
a sixth transistor having a sixth gate, a sixth source and a sixth drain, wherein the sixth gate is configured to receive the fifth input signal, one of the sixth source and the sixth drain is configured to receive a reference voltage, and another of the sixth source and the sixth drain is coupled to the second node;
wherein:
when i is equal to (n−3), the fifth input signal is the third clock signal;
when i is equal to (n−2), the fifth input signal is the fourth clock signal;
when i is equal to (n−1), the fifth input signal is the first clock signal; and
when i is equal to n, the fifth input signal is the second clock signal;
wherein n is an integer less than or equal to (M+N+3) and multiple of 4.

13. The gate driving circuit of claim 1, wherein when i is an integer from 4 to (M+N), the first pull-down unit comprises:
a seventh transistor having a seventh gate, a seventh source and a seventh drain, wherein the seventh gate is configured to receive a starting signal, one of the seventh source and the seventh drain is configured to receive a reference signal, and another of the seventh source and the seventh drain is coupled to the first node.

14. The gate driving circuit of claim 1, further comprising:
$1^{st}$ to $N^{th}$ stage second shift registers configured to respectively generate and output $1^{st}$ to $N^{th}$ stage second scan signals to the scan lines of the display panel; and
one or more second dummy shift registers configured to respectively generate and output one or more second dummy scan signals before the second scan signals are generated;
wherein the one or more second dummy scan signals and the second scan signals are sequentially outputted, the one or more second dummy scan signals respectively have substantially the same time sequences as those of the one or more first dummy scan signals, and the second scan signals respectively have substantially the same time sequences as those of the first scan signals.

15. The gate driving circuit of claim 14, wherein the first shift registers and the second shift registers are respectively disposed at two opposite sides of the display panel.

16. A display device, comprising:
a display panel having opposite first and second sides;
a first driving circuit disposed at the first side of the display panel and configured to drive the display panel, the first driving circuit comprising:
$1^{st}$ to $N^{th}$ stage first shift registers configured to respectively generate and output $1^{st}$ to $N^{th}$ stage first scan signals to a plurality of scan lines of the display panel; and
one or more first dummy shift registers configured to respectively generate and output one or more first dummy scan signals before the first scan signals are generated;
wherein the one or more first dummy scan signals and the first scan signals are sequentially outputted, and N is an integer;
wherein a $j^{th}$ stage first dummy shift register of the one or more first dummy shift registers is defined as a $j^{th}$ stage shift register of the first driving circuit, a $j^{th}$ stage first dummy scan signal of the one or more first dummy scan signals is defined as a $j^{th}$ stage scan signal of the first driving circuit, the $k^{th}$ stage first shift register of the $1^{st}$ to $N^{th}$ stage first shift registers is defined as a $(k+M)^{th}$ stage shift register of the first driving circuit, and the $k^{th}$ stage first scan signal of the $1^{st}$ to $N^{th}$ stage first scan signals is defined as a $(k+M)^{th}$ stage scan signal of the first driving circuit, wherein an $i^{th}$ stage shift register of the shift registers of the first driving circuit comprises:
a precharge unit configured to receive a first input signal and a second input signal and to output a first control signal via a first node;
a first pull-down unit coupled to the first node and configured to receive a third input signal;
an output unit configured to receive a fourth input signal and the first control signal and to output an $i^{th}$ stage scan signal of the plurality of scan signals of the first driving circuit via a second node; and
a second pull-down unit coupled to the second node and configured to receive a fifth input signal;
wherein the fourth input signal and the fifth input signal of the $i^{th}$ stage shift register are respectively ones of first to fourth clock signals, M is an integer, j is an integer less than or equal to M, and k is an integer less than or equal to N.

17. The display device of claim 16, wherein the one or more first dummy shift registers are $1^{st}$ to $M^{th}$ stage first dummy shift registers, and M is an integer multiple of 2.

18. The display device of claim 16, wherein the one or more first dummy shift registers are $1^{st}$ to $M^{th}$ stage first dummy shift registers, and M is an integer greater than or equal to 3.

19. The display device of claim 16, wherein the one or more first dummy shift registers are $1^{st}$ to $M^{th}$ stage first dummy shift registers, and M is 4.

20. The display device of claim 16, further comprising:
a second driving circuit disposed at the second side of the display panel and configured to drive the display panel, the second driving circuit comprising:
$1^{st}$ to $N^{th}$ stage second shift registers configured to respectively generate and output $1^{st}$ to $N^{th}$ stage second scan signals to the scan lines of the display panel; and
one or more second dummy shift registers configured to respectively generate and output one or more second dummy scan signals before the second scan signals are generated;
wherein the one or more second dummy scan signals and the second scan signals are sequentially outputted, the one or more second dummy scan signals respectively have substantially the same time sequences as those of the one or more first dummy scan signals, and the second scan signals respectively have substantially the same time sequences as those of the first scan signals;
wherein a $l^{th}$ stage second dummy shift register of the one or more second dummy shift registers is defined as a $l^{th}$ stage shift register of the second driving circuit, a $l^{th}$ stage second dummy scan signal of the one or more second dummy scan signals is defined as a $l^{th}$ stage scan signal of the second driving circuit, the $p^{th}$ stage second shift register of the $1^{st}$ to $N^{th}$ stage second shift registers is defined as a $(p+M)^{th}$ stage shift register of the second driving circuit, and the $p^{th}$ stage second scan signal of the $1^{st}$ to $N^{th}$ stage second scan signals is defined as a $(p+M)^{th}$ stage scan signal of the second driving circuit, wherein a $q^{th}$ stage shift register of the shift registers of the second driving circuit comprises:

a precharge unit configured to receive a sixth input signal and a seventh input signal and to output a second control signal via a third node;

a first pull-down unit coupled to the third node and configured to receive an eighth input signal;

an output unit configured to receive a ninth input signal and the second control signal and to output an $i^{th}$ stage scan signal of the plurality of scan signals of the second driving circuit via a fourth node; and a second pull-down unit coupled to the fourth node and configured to receive a tenth input signal;

wherein the ninth input signal and the tenth input signal of the $i^{th}$ stage shift register of the second driving circuit are respectively ones of the first to fourth clock signals, 1 is an integer less than or equal to M, and p is an integer less than or equal to N.

* * * * *